United States Patent [19]

Calderbank et al.

[11] E Patent Number: Re. 33,041

[45] Reissued Date of Patent: Aug. 29, 1989

[54] MULTI-DIMENSIONAL CODING FOR ERROR REDUCTION

[75] Inventors: Arthur R. Calderbank, Plainfield; Neil J. A. Sloane, Highland Park, both of N.J.

[73] Assignees: American Telephone and Telegraph Company, New York, N.Y.; AT&T Bell Laboratories, Murray Hill, N.J.

[21] Appl. No.: 85,689

[22] Filed: Aug. 17, 1987

Related U.S. Patent Documents

Reissue of:

[64] Patent No.: 4,581,601
Issued: Apr. 8, 1986
Appl. No.: 624,274
Filed: Jun. 25, 1984

[51] Int. Cl.[4] ..... H03M 7/00

[52] U.S. Cl. ..... 341/50; 375/42; 375/38; 375/39

[58] Field of Search ..... 340/347 DD; 375/38, 375/39, 42, 67, 94; 341/50

[56] References Cited

U.S. PATENT DOCUMENTS

| | | | |
|---|---|---|---|
| 3,909,721 | 9/1975 | Bussgang et al. | 375/67 X |
| 4,077,021 | 2/1978 | Csajka et al. | 332/9 |
| 4,084,137 | 3/1978 | Welti | 375/38 |
| 4,247,944 | 1/1981 | Sifford | 375/94 |

OTHER PUBLICATIONS

S. M. Bergmann and D. P. Taylor, "Error-Rate for the 9600 Bps Signalling Configuration of the V29 Modem". Canadian Elec. Eng. J., vol. 6, No. 1, 1981, pp. 16–19.

"The Viterbi Algorithm", by G. D. Forney, Jr., Proceedings of the IEEE, Mar. 1973, vol. 61, No. 3, pp. 268–278.

"Channel Coding with Multilevel/Phase Signals", by G. Ungerboeck, IEEE Transaction on Inform. Theory, Jan. 1982, vol. 1T-28, pp. 55–67.

"PCM/FDMA Satellite Telephony with 4-Dimensionally-Coded Quadrature Amplitude Modulation", by Welti, COMSAT Tech. Review, vol. 6, No. 2, 1976, pp. 323–338.

"Four-Dimensional Modulation and Coding: An Alternate to Frequency-Reuse", by Wilson et al. Research Lab. for Eng. Science, U. of Virginia, Sep. 1983, No. UVA/532422/EE84/102.

"Efficient Modulation for Band-Limited Channels", by Forney et al., IEEE Trans. on Communications, Jul. 1984 (special edition to be issued).

"Efficient Modulation for Bank-Limited Channels", by G. D. Forney, Jr. et al., IEEE Jour. on Selected Areas in Com., vol. SAC-2, No. 5, Sep. 1984, pp. 632–647.

*Primary Examiner*—William M. Shoop, Jr.
*Assistant Examiner*—Saul M. Bergmann
*Attorney, Agent, or Firm*—Ronald D. Slusky

[57] ABSTRACT

A stream of binary bits is converted into blocks of eight parallel bits. A first group of five of the eight bits addresses a memory device which has thirty-two code words each having four numbers representing the coordinates of signal points in four-dimensional space. The remaining three of the eight bits are expanded to four bit by a convolutional encoder having three bits of memory. These four bits are then used to multiply the four numbers of a code word read out from the memory device. This method permits a block of eight binary bits to be coded into any one of five hundred and twelve four-dimensional code words.

30 Claims, 5 Drawing Sheets

3/4 CODE RATE (4,3,3) CONVOLUTIONAL CODE

MULTI-DIMENSIONAL CODING FOR ERROR REDUCTION

Matter enclosed in heavy brackets [ ] appears in the original patent but forms no part of this reissue specification; matter printed in italics indicates the additions made by reissue.

TECHNICAL FIELD

This invention relates to coding information so as to reduce errors caused by transmission from being included in the received signal and, in particular, to multidimensional coding.

BACKGROUND OF THE INVENTION

When information is sent from a transmitter over a channel to a receiver, the information signals are often distorted by noise and other causes. Sometimes the information signals are distorted to such an extent that the received signals do not duplicate the information sent.

In order to reduce errors in the received signals, the information is coded at the transmitter. There are two basic coding schemes: block coding and convolution coding. These coding schemes are explained in detail in a book entitled "Error Control Coding: Fundamentals and Applications" by S. Lin et al.

Simply stated, block coding introduces n-k redundant bits to a block of k bits of information to derive a coded block of n bits which is transmitted to a receiver. For binary signals, there are $2^k$ code words, each of length n, and the set is called (n, k) block code. Convolutional coding introduces m bits from previous blocks of information, each having k bits, to derive a coded signal having n bits. The encoder is said to have a memory order of m. The set of codes is called an (n, k, m) convolutional code. The code rate is k/n.

U.S. Pat. No. 4,077,021 teaches a technique called set partitioning that assigns signal points to successive blocks of input data. More particularly, a code rate of 4 bits/2-dimensional symbol is shown. Also, a coding gain of 4 db over standard uncoded transmission is obtained. That is, noise immunity is obtained without increasing the power required for transmission. As will be described fully in the detailed description of the present invention, it is desirable to obtain a more efficient coding scheme.

SUMMARY OF THE INVENTION

In accordance with the illustrative embodiment of the present invention there is disclosed a multidimensional coder which (1) reduces the power consumed, (2) achieves a high code rate, and (3) provides an efficient scheme by low power use and low error in the received signal.

More particularly, according to one embodiment of the present invention, an information block comprising eight bits of input to the coder is converted into any one of five hundred and twelve four-dimensional code words. The eight bits are change into [an output having] nine bits by [retaining] *a convolutional coder which retains* two input bits from the immediately preceding block and one input bit from [two preceding blocks] *the block before that one*. The [output is] *nine bits are* divided into two signal groups: a first group comprises five bits and a second comprises four bits.

The first group having five uncoded bits addresses any one of thirty-two ($2^5=32$) locations of a read only memory. Each location has a code word comprising four numbers, representing the coordinates of a point in four-dimensional space. The numbers appearing in the thirty-two code words include 1, −1, 3, −3, 5, and −5. These code words are shown in tables 1 and 2, included in the detailed description of the invention hereinbelow.

The second group of four bits make up a vector which determines the sign of the four-dimensional code word read from the read only memory. This scheme is equivalent to having the code word read from any page of a code book having sixteen ($2^4=16$) pages, each page having thirty-two code words entered therein.

Thus, there is disclosed a trellis code with rate of eight bits per four-dimensional symbol with a gain of 4.7 decibels over standard uncoded transmission. This 0.7 decibel increase over the aforesaid prior art code systems corresponds to improving the block error rate by a factor of 10. The signal constellation comprises five hundred twelve four-dimensional signal points, that is, each symbol has a set of four numbers which defines a signal point in four-dimensional space.

By way of comparison, first, transmission of two consecutive two-dimensional signals using one of the prior art codes with rate four bits per two-dimensional symbol would require the equivalent of 1, 024 (because $32^2=1024$) four-dimensional signal points. That is, the size of the code is reduced. Second, the restriction of the five hundred twelve point constellation to the first two coordinates, or to the last two coordinates, requires only a set of thirty-two signal points. This code rate of eight bits per four-dimensional symbol is suggested for data transmission rates of 9.6 kbits/sec.

In another embodiment of the present invention, a trellis code with rate twelve bits per four-dimensional symbol provides a gain of 4.9 db over standard uncoded transmission. This method is suggested for data transmission rates of 14.4 kbits/sec.

In the limit, when the number, k, of bits in a block approaches infinity, the coding gain is asymptotic to 4.9715 decibels. That is, the difference between the limiting gain and that provided with k=12 is very small.

DETAILED DESCRIPTION

Figure 1:
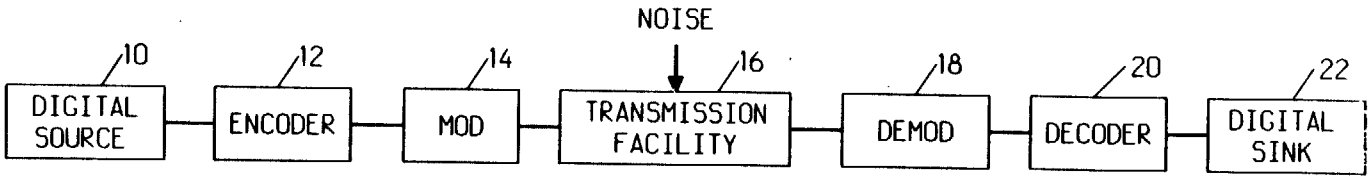
FIG. 1 is a prior art system for transmission of encoded signals.

Referring to FIG. 1, there is shown a prior art system comprising a digital source 10 supplying a signal to encoder 12. The coded signal from encoder 12 is modulated by device 14 for transmission to a distance location where the signal is demodulated at device 18. The demodulated signal is thereafter decoded at device 20 and sent on to a digital sink 22. The use of encoder 12 reduces the errors caused by noise in the transmission facility 16. The present invention relates to an improvement in the aforesaid encoder 12.

Figure 2:
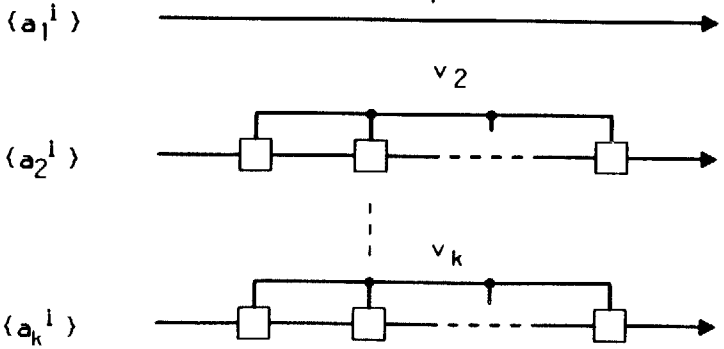
FIG. 2 illustrates the concept of convolutional encoders.
Figure 7:
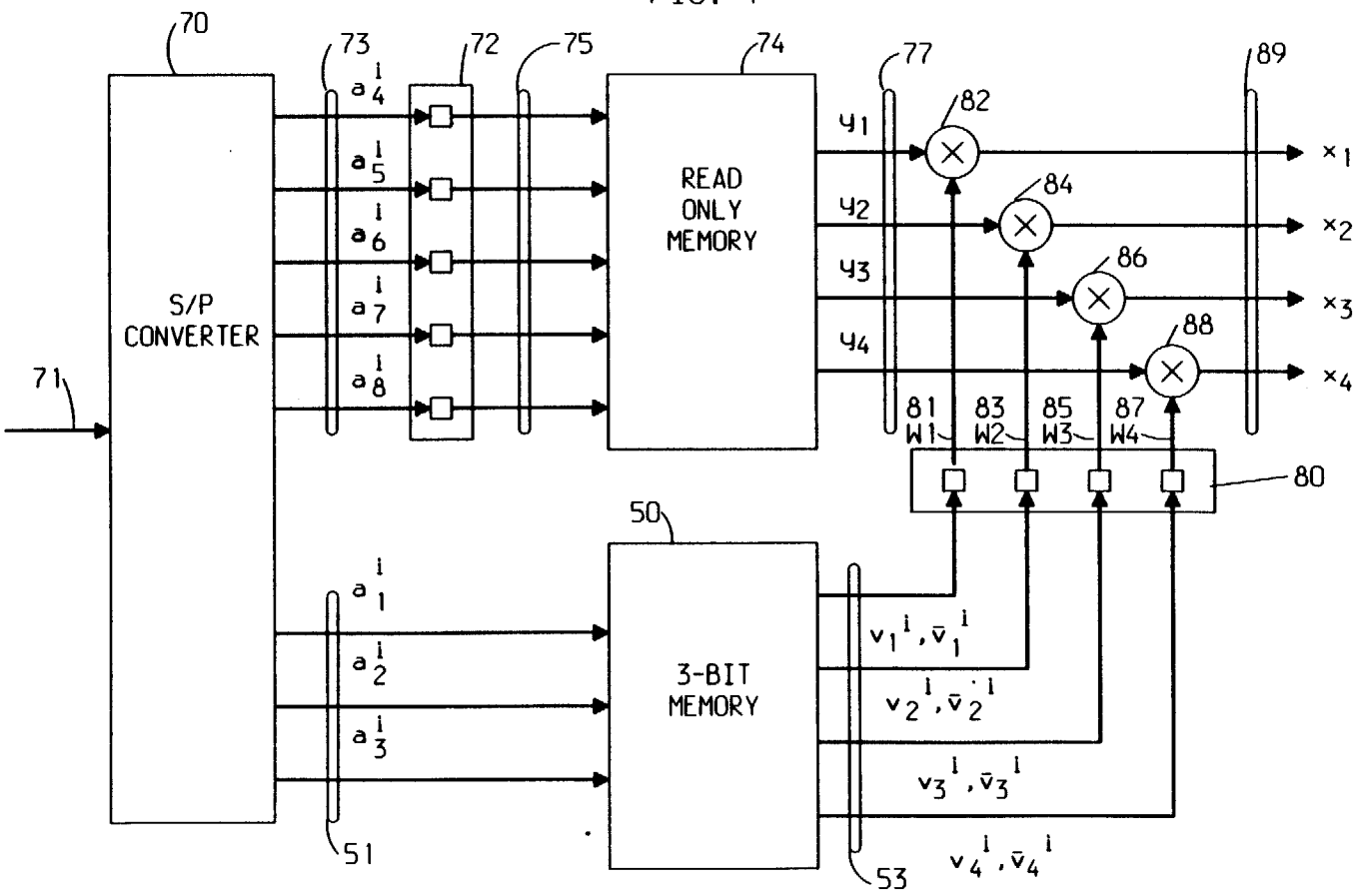
FIG. 7 shows a convolutional encoder embodying the present invention.

It is necessary to disclose the theoretical basis for the present invention in order to fully appreciate it. Assume that an input block of k bits from a serial bit stream is first converted by a series-to-parallel converter such as device 70 in FIG. 7, such converters being well known, to an input of k parallel bits $\{a_1^i\}, \{a_2^i\}, \{a_3^i\}, \ldots, \{a_k^i\}$ prior to entering the encoder at time i. Assume further that the output of the encoder, at time i, is $x^i$ and depends not only on the present value of the input sequence but also on the previous $v_i \geqq 0$ bits as illustrated in FIG. 2. That is, the encoder is a convolutional encoder as well as a block encoder. If $v_j=0$ then $\{a_j^i\}$ is said to be a sequence of uncoded bits. The constraint length v is given by $$v = \sum_{i=1}^{k} v_i.$$

The output of $x^i$ of the encoder is a fixed function x of the (v+k) variables $a_1^i, \ldots, a_1^{i-v1}; a_2^i, \ldots, a_2^{i-v2}; a_3^i, \ldots, a_3^{i-v3}; \ldots; a_k^i, \ldots, a_k^{i-vk}$. That is, $$x^i = x(a_1^i a_1^{i-1} \ldots a_1^{i-v1}; \ldots; a_k^i a_k^{i-1} \ldots a_k^{i-v1}).$$

The v-tuple $(a_1^1 a_1^{i-1} \ldots a_1^{i-v1}; \ldots; a_k^i a_k^{1-l} \ldots a_k^{i-v1})$ is the state of the encoder and there are $2^k$ states.

Figure 3:
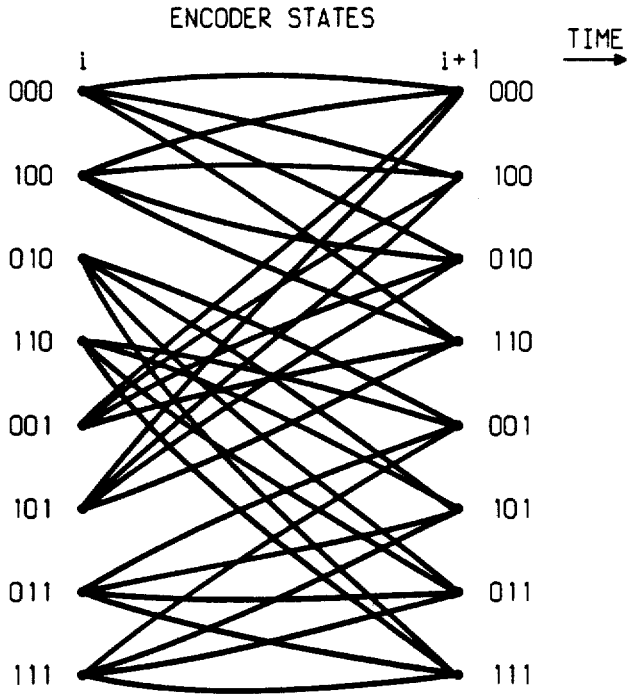
FIG. 3 shows possible transitions of states between two instants in time.

Referring to FIG. 3, there is shown a state transition diagram from time i to time (i=1) for a trellis code with $k=3$, $v_1=0$, $v_2=1$, and $v_3=2$. Looking briefly ahead to FIG. 5, there is shown a coder, which is an application of FIG. 2, where the $a_1^i$ sequence has no memory, that is, $v_1=0$, or uncoded; where $a_2^i$ sequence has one bit of memory, that is, $v_2=1$; and, where the $a_3^i$ sequence has two bits of memory, that is, $v_3=2$. Because three bits of memory exist, there are $(2^3=8)$ eight states for the coder. The three bits shown at time i are the bits stored for $a_2$ at time (i−1), that is, $a_2^{i-1}$; for $a_3$ at time (i−1), that is, $a_3^{i-1}$; and $a_3$ at time (i−2), that is, $a_3^{i-2}$. An edge joins two states at time i and i+1. Each edge is double in this case, as will be explained below.

The state transition diagram can be understood by examining, for example, the transition from the state '010' at time i to a state at time i+1. Remembering that at time i the 1 in state '010' is $a_3^{i-1}$, at time i+1 this bit 1 will now be $a_3^{i-2}$ and can be any one of the four codes which end in a 1:001, 101, 011, or 111 depending on the next value of $a_2^{i-i}$ and $a_3^{i-1}$.

Returning to the theoretical basis, noise in the transmission channes distorts the sequence of signals from the output of the coder:

$$x^i = (x^{i1}, x^{i2}, x^{i3}, x^{i4}).$$

Then, the signal received say at decoder 20 of FIG. 1, is:

$$r^i = (r^{i1}, r^{i2}, r^{i3}, r^{i4})$$

where $r^{ij} = x^{ij} + z^{ij}$, the $z^{ij}$ being the noise component. The noise samples $z^{ij}$ are independent zero-mean Gaussion variables of variance, $\sigma^2$.

The Viterbi algorithm, disclosed at 61 Proceedings of the IEEE 268–278 (No. 3, March, 1973), is used to find the most likely path through the trellis given the observed sequence $\| r^i \|$. The path chosen will not always coincide with the correct path, but will occasionally diverge from it and remerge at a later time. This is called an error event.

An error event E of the length l lasts from j to (j+1), the sequence $x^j, \ldots, x^{(j+l-L)}$ instead of the correct sequence $x^j, \ldots, x^{(j+1-L)}$. The squared Euclidean distance $d^2$, that is $d^2(E)$, between the two paths of E is given by $$d^2 = \sum_{i=j}^{j+1-l} \| x^1 - x^1 \|^2.$$

where $\| \quad \|$ denotes the usual Euclidean norm.

Figure 4:
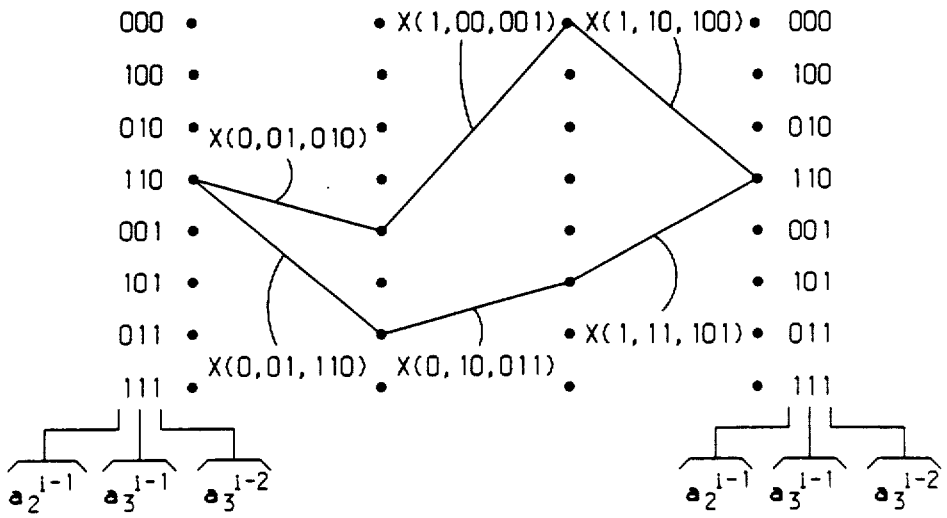
FIG. 4 illustrates error events and the term Euclidean distance.

Referring to FIG. 4, there is shown an error event for which the squared Euclidean distance is $$\begin{aligned} d^2 = \; & \| x(0{:}\,01{:}\,010) - x(0{:}\,01{:}\,110) \|^2 + \\ & \| x(1{:}\,00{:}\,001) - x(0{:}\,10{:}\,011) \|^2 + \\ & \| x(1{:}\,10{:}\,100) - x(1{:}\,11{:}\,101) \|^2 \end{aligned}$$

The average transmitted power is given by $$P = \frac{1}{2^{\lambda+r}} \Sigma \| x(a_1' \ldots a_1^{1-vl} \ldots a_k^{1-vk}) \|^2.$$

For small noise variance $\sigma^2$, the minimum distance $d_{min}$ over all error events determines the probability of error. The figure of merit for a trellis code is the normalized minimum distance stated by the ratio:

$$\frac{d_{min}^2}{P}.$$

The bigger this ratio, the better the code. The performance of a coding scheme is measured against that of uncoded transmission at the same rate. The coding gain in decibels, db, is given by the expression:

$$10 \log_{10} \left[ \frac{\left[ \frac{d_{min}^2}{P} \right]_{codded}}{\left[ \frac{d_{min}^2}{P} \right]_{uncoded}} \right]$$

Figure 5:
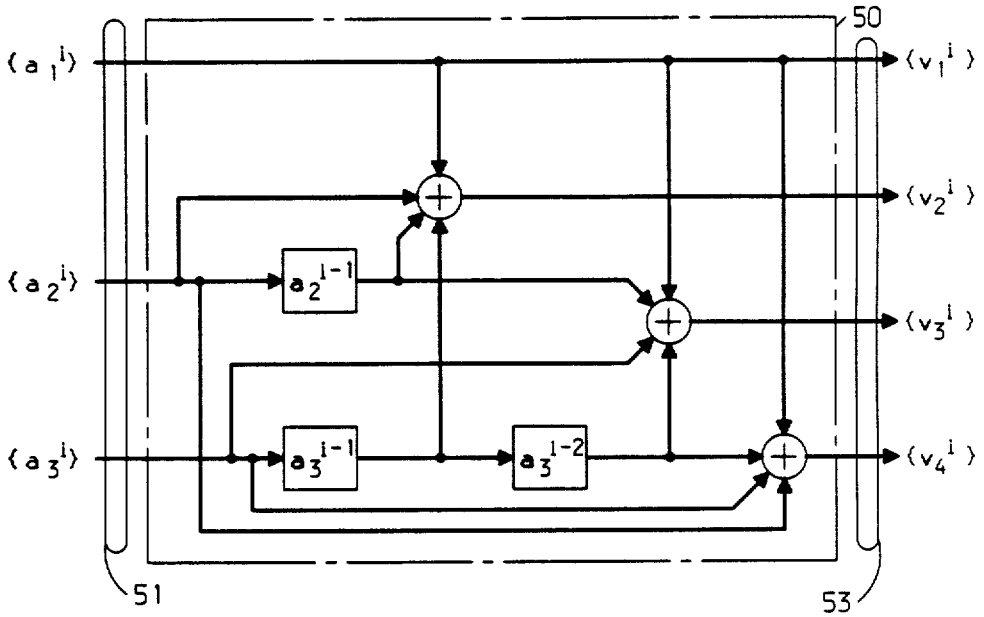
FIG. 5 shows a convolutional encoder of memory order three.

Basic to the trellis codes of the present invention disclosed hereinbelow is a rate ¾ binary convolutional code with a total memory 3 and free distance 4. A portion of the encoder is shown in FIG. 5 which has been disclosed in the aforesaid Lin book at page 292. The three parallel input sequences $a_1^i$, $a_2^i$ and $a_3^i$ determine the output sequence $v^i = (v_1^i, v_2^i, v_3^i, v_4^i)$ according to the rules:

$$v_1^i = a_1^i,$$

$$v_2^i = a_1^i + a_2^i + a_2^{i-1} + a_3^{i-1},$$

$v_3^i = a_1^i + a_2^{i-1} + a_3^i + a_3^{i-2}$, and $v_4^i = a_1^i + a_2^i + a_3^i + a_3^{i-2}$.

The bits $a_2^{i-1}$, $a_3^{i-1}$, and $a_3^{i-2}$ describe the state of the encoder. The possible transitions between states of such an encoder is shown hereinabove in FIG. 3. The edge joining state $a_2^{1-1}\ a_3^{i-1}\ a_3^{i-2}$ to state $a_2^i\ a_3^i\ a_3^{i-1}$ is labelled with the outputs $V^i = (v_1^i, v_2^i, v_3^i, v_4^i)$ and $\bar{V}^i = (\bar{v}_1^i, \bar{v}_2^i, \bar{v}_3^i, \bar{v}_4^i)$ corresponding to this transition so that $v_1^i = a_1^i$, $v_2^i = a_1^i + a_2^{i-1} + a_2^i + a_3^{i-1}$, $v_3 = a_1^i + a_2^{i-1} + a_3^i + a_3^{i-2}$, and $v_4 = a_1^i + a_2^i + a_3^i + a_3^{i-2}$.

The binary notation 0,1 is then changed to 1, −1, respectively. An edge joining two states is then labelled with a pair of vectors $(w_1, w_2, w_3, w_4)$ and $(-w_1, -w_2, -w_3, -w_4)$ where $w_i = \pm 1$ and $i = 1, 2, 3$, and 4. This defines a trellis encoder with rate 3 bits/4-dimensional symbol. The minimum squared distance of this trellis code is simply four times the free distance of the original binary convolutional code, namely 16. This is so because 0 opposite 1 contributes 1 to the free distance while 1 opposite −1 contributes 4 to the squared minimum distance.

Thus far, a trellis code at the low rate 3 bits/4-dimensional symbol was disclosed. Transmission at higher rates, say 8 bits/4-dimensional symbol or 12 bits/4-dimensional symbol requires more channel symbols. Indeed, as is readily apparent from the disclosure thus far, in order to achieve any coding gain, more symbols are needed than for uncoded transmission at the same rate.

Figure 6:
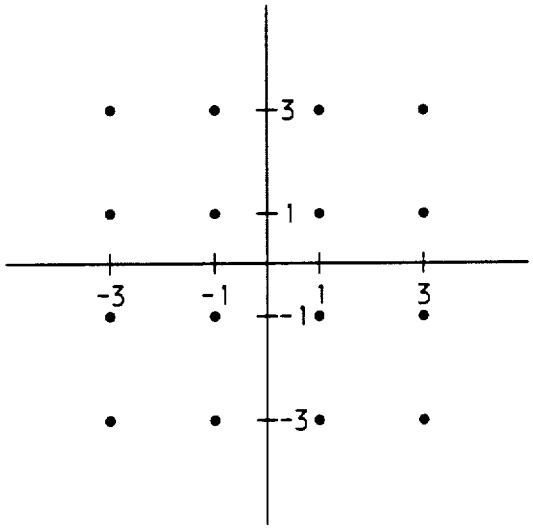
FIG. 6 shows a signal constellation for uncoded transmission at the rate four bits per two dimensional symbol.

Referring to FIG. 6, there is shown a rectangular constellation comprising sixteen ($2^4 = 16$) signal points for standard uncoded transmission, of binary input, at the rate of 4 bits/2-dimensional symbol. For uncoded transmission of a 4-dimensional symbol, two copies of the constellation shown in FIG. 6 are needed, [yeilding] *yielding* 256 ($16 \times 16 = 256$) possible signals. Using the formula developed earlier herein, the average power or energy is $$4\frac{(1^2 - 3^2)}{2}.$$

that is, 20. Because the minimum squared distance between distinct signals is four, the figure of merit is given by the formula:

$$\left[\frac{d^2_{min}}{P}\right]_{uncoated} = \frac{4}{20}.$$

For coded transmission, however, 512 signal points are used, namely, twice the signal constellation for uncoded transmission of 4-dimensional symbols. This is so because a block of eight input bits is converted to nine bits using three bits from prior blocks and $2^9$ is 512. This conversion will become clear by referring to FIG. 7, wherein is shown a stream of binary bits on lead 71 converted from serial to parallel in converter 70 and then set on via two sets of leads 73 and 51.

The first set of leads 73 carries five uncoded bits which are converted from binary form by changing a 0 to a 1 and a 1 to a −1 in known device 72 and then sent on via leads 75 to address any one of thirty-two ($2^5 = 32$) code words, representing signal points, from a storage device such as read only memory (ROM) 74. Because each code word defines a point in four dimensional space, four numbers are required for each code word. The numbers of the addressed code word are passed via leads 77 to multipliers 82 . . . 88. Representative signal points are shown in Table 1 hereinbelow.

TABLE 1

| Representative Signal Point | Energy Level or Average Power | $\frac{1}{16} \times$ Number |
|---|---|---|
| (1111) | 4 | 1 |
| (3111) | 12 | 4 |
| (3311) | 20 | 6 |
| (5111) | 28 | 4 |
| (3331) | 28 | 4 |
| (5311) | 36 | 12 |
| (3333) | 36 | 1 |
| Total number of code words | | 32 |

The first column of Table 1 shows the code words representative of signal points in four dimensional space. The number of permutations for each representative code word is shown in column three, giving a total of thirty-two code words stored in ROM 74. The list of thirty-two code words is obtained by permuting the coordinates of the code words in column one.

The second set of leads 51 from serial to parallel converter 70 carries three of the binary input bits to a device 50 which stores three bits from prior blocks as disclosed in detail earlier herein with reference to FIG. 5, and delivers four bits on leads 53 to a device 80, At device 80 the binary bit 0 is converted to 1 and a binary 1 is converted to a −1. The vector W of four bits $w_1$, $w_2$, $w_3$, and $w_4$ is then delivered to multipliers 82 . . . 88. The number $y_1$ of the accessed code word is then multiplied by $w_1$ from lead 81 at multiplier 82 to generate output $x_1$. That is, $y_1$ is negated if $w_1$ is −1 but remains unchanged if $w_1$ is +1. Likewise, $x_2$, $x_3$, and $x_4$ are generated and sent over leads 89.

Because there are four bits $w_1$, $w_2$, $w_3$, and $w_4$, and because there are two values 1 or −1 for each, together there can be sixteen ($2^4 = 16$) different permutations of these bits. Because there are thirty-two signal points ($x_1$, $x_2$, $x_3$, $x_4$) in the set S(w) which satisfy the requirement $x_i \equiv w_i \pmod 4$, for $i = 1, 2, 3$, and 4, there are 512 ($16 \times 32 = 512$) symbols in the signal constellation, because all permutations are allowed. Thus, the coding scheme of the present invention can be thought of as a code book comprising sixteen pages with thirty-two code words on each page. Each page corresponds to the vector $w_i$, where $i = 1, 2, 3$, and 4. The thirty-two code words correspond to the entries in ROM 74. The entire list of thirty-two code words in ROM 74 is shown in Table 2 hereinbelow.

TABLE 2

| Input to ROM 74 | | | | | Code Output From ROM 74 | | | |
|---|---|---|---|---|---|---|---|---|
| $a_4$ | $a_5$ | $a_6$ | $a_7$ | $a_8$ | $y_1$ | $y_2$ | $y_3$ | $y_4$ |
| | 1 | 1 | 1 | 1 | 1 | 1 | 1 | 1 |
| −1 | 1 | 1 | 1 | 1 | 3 | 1 | 1 | 1 |
| 1 | −1 | 1 | 1 | 1 | 1 | 3 | 1 | 1 |
| −1 | −1 | 1 | 1 | 1 | 1 | 1 | 3 | 1 |

TABLE 2-continued

| Input to ROM 74 | | | | | Code Output From ROM 74 | | | |
|---|---|---|---|---|---|---|---|---|
| $a_4$ | $a_5$ | $a_6$ | $a_7$ | $a_8$ | $y_1$ | $y_2$ | $y_3$ | $y_4$ |
| 1 | 1 | −1 | 1 | 1 | 1 | 1 | 1 | 3 |
| −1 | 1 | −1 | 1 | 1 | 3 | 3 | 1 | 1 |
| 1 | −1 | −1 | 1 | 1 | 3 | 1 | 3 | 1 |
| −1 | −1 | −1 | 1 | 1 | 3 | 1 | 1 | 3 |
| 1 | 1 | 1 | −1 | 1 | 1 | 3 | 3 | 1 |
| −1 | 1 | 1 | −1 | 1 | 1 | 3 | 1 | 3 |
| 1 | −1 | 1 | −1 | 1 | 1 | 1 | 3 | 3 |
| −1 | −1 | 1 | −1 | 1 | 5 | 1 | 1 | 1 |
| 1 | 1 | −1 | −1 | 1 | 1 | 5 | 1 | 1 |
| −1 | 1 | −1 | −1 | 1 | 1 | 1 | 5 | 1 |
| 1 | −1 | −1 | −1 | 1 | 1 | 1 | 1 | 5 |
| −1 | −1 | −1 | −1 | 1 | 3 | 3 | 3 | 1 |
| 1 | 1 | 1 | 1 | −1 | 3 | 3 | 1 | 3 |
| −1 | 1 | 1 | 1 | −1 | 3 | 1 | 3 | 3 |
| 1 | −1 | 1 | 1 | −1 | 1 | 3 | 3 | 3 |
| −1 | −1 | 1 | 1 | −1 | 5 | 3 | 1 | 1 |
| 1 | 1 | −1 | 1 | −1 | 5 | 1 | 3 | 1 |
| −1 | 1 | −1 | 1 | −1 | 5 | 1 | 1 | 3 |
| 1 | −1 | −1 | 1 | −1 | 3 | 5 | 1 | 1 |
| −1 | −1 | −1 | 1 | −1 | 1 | 5 | 3 | 1 |
| 1 | 1 | 1 | −1 | −1 | 1 | 5 | 1 | 3 |
| −1 | 1 | 1 | −1 | −1 | 3 | 1 | 5 | 1 |
| 1 | −1 | 1 | −1 | −1 | 1 | 3 | 5 | 1 |
| −1 | −1 | 1 | −1 | −1 | 1 | 1 | 5 | 3 |
| 1 | 1 | −1 | −1 | −1 | 3 | 1 | 1 | 5 |
| −1 | 1 | −1 | −1 | −1 | 1 | 3 | 1 | 5 |
| 1 | −1 | −1 | −1 | −1 | 1 | 1 | 3 | 5 |
| −1 | −1 | −1 | −1 | −1 | 3 | 3 | 3 | 3 |

The set of coordinates ($x_1$, $x_2$, $x_3$, $x_4$) representing the input block of 8 bits on leads 89 is then sent on to a modulator. The present invention relates to an encoder only and therefore other equipment cooperating with the encoder is not disclosed in any detail, beyond what was disclosed earlier with reference to FIG. 1.

The distance d(A, B) between two sets of vectors A and B is given by the expression:

$$d(A,B) = \min_{x \in A, v \in B} \{ \| x - y \| \}.$$

The partition into sets S(w) satisfies the following metric properties:

(M1): if x, y$\epsilon$S(w), then $\| x-y \|^2 \geqq 16$; and (M2): is $v \neq w$, then $d^2(S(v), S(w)) = \| v-w \|^2$.

To verify (M1), let $x=(x_1, x_2, x_3, x_4)$ and $y=(y_1, y_2, y_3, y_4)$. Then $x_i \neq y_i$ for some i. Since $x_i \equiv y_i$ (mode 4), we have $\| x-y \| \geqq 16$. To verify (M2), let $x=(x_1, x_2, x_3, x_4) \epsilon S(w)$, and $y=(y_1, y_2, y_3, y_4) \epsilon S(w)$. If $x_i \not\equiv y_i$(mod 4), then $|x_i - y_i|^2 \geqq 4$. Hence $\| x-y \|^2 \geqq \| v-w \|^2$ and the equality holds when x=v and y=w.

Earlier hereinabove, a trellis code with rate 3 bits/4-dimensional symbol having a minimum squared distance $d_{min}^2=16$ was disclosed. In order to achieve a higher transmission rate of 8 bits/4-dimensional symbol, five uncoded bits were added, obtaining an input of eight parallel sequences to the encoder in FIG. 7: $\{a_1^i\}$, $\{a_2^i\}$, $\{a_3^i\}$, . . . , $\{a_8^i\}$. The sequences $\{a_2^i\}$, $\{a_3^i\}$ determine the state $a_2^{i-1}\, a_3^{i-1}\, a_3^{i-2}$ of the encoder in FIG. 7. An edge joining two states that was originally labelled by the pair of vectors ±w in FIG. 3 is now labelled by the sixty-four vectors (not shown) in the set S(v) U S(−v). This is so because there are sixty-four parallel transitions between states $a_2^{i-1}\, a_3^{i-1}\, a_3^{i-2}$ and $a_2^i\, a_3^i\, a_3^{i-1}$ corresponding to the sixty-four possible inputs $a_1^i\, a_4^i$ . . . $a_8^i$. Furthermore, any fixed assignment of code symbol in S(v) U S(−v) to inputs $a_1^i$ [$a_{4hu\ i}$] $a_4^i$ . . . $a_8^i$ is permitted.

The properties (M1) and (M2) guarantee that the squared distance of any error event of length l is at least 16. Consider any error event in the eight state trellis of length greater than 1. If the squared distance for the low-rate code is $$\sum_{i=1}^{l} \| v^i - v^1 \|^2$$

then the squared distance for the high rate code is at least $$\sum_{i=1}^{l} d^2 (S(v) \cdot S(v))$$

The property (M2) implies that the minimum squared distance of the high-rate code is at least 16. The average signal power P of the 512 point signal constellation is given by the expression:

$$P = \frac{16(4 \times 1 + 12 \times 4 + 20 \times 6 - 28 \times 8 + 36 \times 13)}{512} = 27.$$

Thus, $$\left[ \frac{d_{min}^2}{P} \right]_{coded} = \frac{16}{27}.$$

and the coding gain in db is:

$$10 \log_{10} \left[ \frac{\left[ \frac{d_{min}^2}{P} \right]_{coded}}{\left[ \frac{d_{min}^2}{P} \right]_{uncoated}} \right] = 10 \log_{10} \left[ \frac{\frac{16}{27}}{\frac{4}{20}} \right] \approx 4.717 \text{ db.}$$

Figure 8:
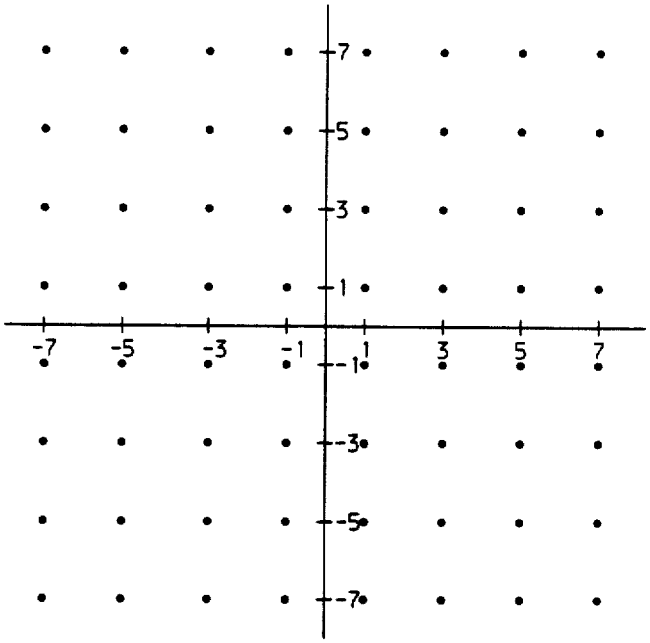
FIG. 8 shows a rectangular constellation for uncoded transmission at six bits per two dimensional symbol.

Referring to FIG. 8, there is shown a signal constellation comprising sixty-four signal points which is used for standard uncoded transmission at the rate of 6 bits/2-dimensional symbol. To transmit a 4-dimensional symbol at a rate of 12 bits/symbol, a constellation comprising two such copies are needed. The number of possible signals will be 4, 096 (64×64=4096). The average signal power P is $$\frac{4(1^2 + 3^2 + 5^2 + 7^2)}{4} 84.$$

Thus, $$\left[ \frac{d_{min}^2}{P} \right]_{uncoded} = \frac{4}{84}.$$

For coded transmission using three bits from prior blocks, 8, 192 ($2^{13}=8192$) signal points are needed. As in the 8 bits/4-dimensional symbol, the signal constellation is partitioned into sixteen sets S(w) according to congruence of the entire modulo 4. Each set S(w) will contain, however, 512 signal points, or code words. Representative signal points are listed hereinbelow in Table 3.

TABLE 3

| Representative | Energy | $\frac{1}{16}$ × Number |
|---|---|---|
| (1111) | 4 | 1 |
| (3111) | 12 | 4 |
| (3311) | 20 | 6 |
| (5111). (3331) | 28 | 4 + 4 = 8 |
| (5311). (3333) | 36 | 12 + 1 = 13 |
| (5331) | 44 | 12 |
| (7111). (5333). (5511) | 52 | 4 + 4 + 6 = 14 |
| (7311). (5531) | 60 | 12 + 12 = 24 |
| (7331). (5533) | 68 | 12 + 6 = 18 |
| (7333). (5551). (7511) | 76 | 4 + 4 + 4 + 12 = 20 |
| (9111). (7531). (5553) | 84 | 4 + 24 + 4 = 32 |
| (9311). (7533) | 92 | 12 + 12 = 24 |
| (9331). (7711). (7551). (5555) | 100 | 12 + 6 + 12 + 1 = 31 |
| (7553). (9333). (9511). (7731) | 108 | 12 + 4 + 12 + 12 = 40 |
| (9531). (7733) | 116 | 24 + 6 = 30 |
| (9533). (11111). (7751). (7555) | 124 | 12 + 4 + 12 + 4 = 32 |
| (11311). (9711). (9551). (7753) | 132 | 12 + 12 + 12 + 12 = 48 |
| (11331). (9731). (9553) | 140 | 12 + 24 + 12 = 48 |
| (11333). (11511). (9733). (7755). (7771) | 148 | 4 + 12 + 12 + 6 + 4 = 38 |
| (11531). (9555). (9751) (7773) | 156 | 24 + 4 + 24 + 4 = 56 |
| (11533). (9911). (9753) | 164 | only 13 |

In order to obtain a transmission rate of 12 bits/4-dimensional symbol it is necessary to add nine uncoded bits to the four derived bits from FIG. 5, to obtain a total of 13. There are now 1024 parallel transitions between states $a_2^{i-1}\,a_3^{i-1}\,a_3^{i-2}$ and $a_2^{i}a_3^{i}a_3^{i-1}$ in the eight state trellis. If the edge corresponding to this transition was originally labelled ±w, it is now labelled with the 1024 vectors in S(w) U S(−w). The metric properties (M1) and (M2) guarantee that the squared minimum distance of the high-rate code is equal to the squared [mininmum] *minimum* distance of the low-rate code, which is 16. The average signal power is 108.625, and so the figure of merit is:

$$\left[\frac{d^2_{min}}{P}\right]\text{coded} = \frac{16}{108.625}.$$

and the coding gain is:

$$10\log_{10}\left[\frac{\frac{16}{108.625}}{\frac{4}{84}}\right] = 4.905 \text{ db.}$$

Summarizing the aforesaid disclosure, in order to achieve coded transmission at a rate of k bits per four dimensional signal, (k−3) uncoded bits are added to the low rate trellis code, that is, 3 bits per four dimensional symbol, as disclosed hereinabove, with reference to FIG. 3. There are $2^{(k-2)}$ parallel transitions between states $a_2^{i-1}\,a_3^{i-l}a_3^{i-2}$ and $a_2^{i}\,a_3^{i}\,a_3^{i-1}$ in the eight state trellis. Relating this to FIG. 3, there are two parallel transitions between the two aforesaid states because $2^{(3-2)}$ is 2.

Figure 9:
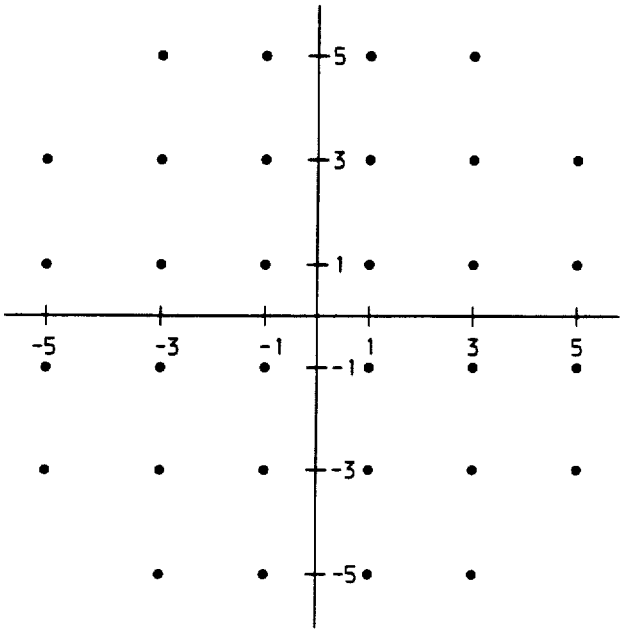
FIG. 9 shows a signal constellation for trellis codes at the rate four bits per two dimensional symbol.

Coded transmission requires $2^{(k+1)}$ signal points. The points of the lattice $(2Z+1)^4$, where (2Z+1) represents the set of odd numbers, lie in shells around the origin consisting of sixteen vectors of energy four, sixty-four vectors of energy twelve, . . . , shown summarized in Table 3. The $2^{k+1}$ signal points are obtained by taking all points of energy four, twelve, twenty, . . . and just enough points of a final shell to bring the total number up to $2^{k+1}$. The signal constellation is partitioned into sixteen sets S(w) according to congruence of the entries modulo four Each set contains $2^{k-3}$ signal points. Thus, when k=8, each set has thirty-two signal points ($2^{8-3}$=32) as is shown in FIG. 9. Edges in the eight state trellis originally labeled ±w are now labelled with the $2^{k-2}$ vectors in S(w) U S(−w). The metric properties (M1) and (M2) guarantee that the minimum squared distance of this trellis is sixteen.

It can be shown that as k increases, that is, in the limiting case, the limiting coding gain is $10\log_{10}\pi$=4.914 db. That is, the maximum coding gain is 4.914 db. But the coding gain for twelve bits per four dimensional symbol is 4.904 db and the coding gain for eight bits per four dimensional symbol is 4.717 db. Thus, the scheme disclosed by the present invention is an efficient method of coding.

What is claimed is:

1. A method for coding information comprising the steps of separating said information into first and second groups of signals, addressing any one of a plurality of multidimensional code words by said first group of signals, and determining the sign of each [componet] *component* of said multidimensional code words by said second group of signals.

2. The method of claim 1 for coding information wherein said multi-dimensional code words are four-dimensional code words.

3. The method of claim 2 for coding information wherein said information comprises a block of eight binary bits, said first group comprises five of said eight binary bits, and said second group comprises the other three of said eight binary bits.

4. The method of claim 3 for coding information wherein said four-dimensional code words consist of a set of thirty-two four-dimensional code words stored in a memory device and each of said four-dimensional code words consist of a subset of four numbers which represent the coordinates of a signal point in four-dimensional space.

5. The method of claim 4 for coding information further comprising the step of converting binary 1's to −1's and binary 0's to 1's for said first group of signals prior to addressing said four-dimensional code words.

6. The method of claim 5 for coding information further comprising the steps of expanding the number of bits in said second group of signals from three to four in a convolutional encoder comprising three bits of memory, and converting the binary 1's to −1's and binary 0's to 1's.

7. The method of claim 6 further comprising the step of multiplying each of said components of said four-dimensional code word by said expanded and converted second group of signals, thereby deriving any one of five hundred and twelve encoded four-dimensional symbols for each input block of eight binary signals.

8. The method of claim 2 for coding information wherein said information comprises a block of twelve binary bits, said first group comprises nine of said binary bits and said second group comprises the other three of said twelve binary bits.

9. The method of claim 8 for coding information wherein said four-dimensional code words consist of a set of five hundred and twelve four-dimensional code words stored in a memory device and each of said four-dimensional code words consist of a subset of four numbers which represent the coordinates of a signal point in four-dimensional space.

10. The method of claim 9 for coding information further comprising the step of converting binary 1's to −1's and binary 0's to 1's for said first group of signals prior to addressing said four-dimensional code words.

11. The method of claim 10 for coding information further comprising the steps of expanding the number of bits in said second group of signals from three to four in a convolutional encoder comprising three bits of memory, and converting the binary 1's to −1's and binary 0's to 1's.

12. The method of claim 11 for coding information further comprising the step of multiplying each of said components of said four-dimensional code word by said expanded and converted second group of signals, thereby deriving any one of eight thousand, one hundred and ninety-two encoded four-dimensional symbols for each input block of twelve binary signals.

13. Apparatus for coding information comprising means for converting a predetermined plurality of serial binary bits into parallel bits, said parallel bits being separated into first and second groups of signals, means for converting the binary 1's to −1's and binary 0's to 1's for said first group of signals which are then used for addressing any one of a plurality of multi-dimensional code words said code words being stored in a memory device, and said second group of signals being used for determining the sign of each component of said multi-dimensional code words after said code words are read out from said memory device.

14. The apparatus of claim 13 wherein said multidimensional code words are four-dimensional code words, each code word comprising four numbers representing the coordinates of a signal.

15. The apparatus of claim 14 comprising a convolutional encoder which comprises means for storing a plurality of bits for expanding the number of bits in said second group of signals, by one, and means for converting the expanded bits from binary 1's to −1's and binary 0's to 1's.

16. The apparatus of claim 15 wherein said memory device is a read only memory.

17. The apparatus of claim 16 for coding information comprising means for multipling each component of the code words from said read only memory by said expanded and converted second group of signals to derive an encoded four-dimensional symbol for each block of information.

18. The apparatus of claim 17 wherein said predetermined plurality of serial binary comprises a block of eight binary bits, said first group comprises five bits of said eight bits, said means for storing a plurality of bits in said convolutional encoder having a capacity for storing three bits, said second group comprises the other three of said eight binary bits, said three bits being the input to said convolutional encoder, the output from said convolutional encoder being four bits, said read only memory comprises a set of thirty-two four-dimensional code words, and said encoded symbols being any one of a signal constellation comprising five hundred and twelve four-dimensional code words.

19. The apparatus of claim 17 wherein said predetermined plurality of serial binary bits comprises a block of twelve binary bits, said first group of signals comprises nine bits of said twelve binary bits, said means for storing a plurality of bits in said convolutional encoder having a capacity for storing three bits, said second group comprises the other three bits of said twelve binary bits as the input to said convolutional encoder, the output from the convolutional encoder being four bits, said read only memory comprises a set of five hundred twelve four-dimensional code words, and said encoded symbols being any one of a signal constellation comprising eight thousand, one hundred and ninety-two four-dimensional code words.

20. Apparatus for coding an input of eight binary bits to any one of five hundred and twelve code words each code word having four numbers representing the coordinates of signal points in four-dimensional space said apparatus comprising a read only memory comprising thirty-two of said four dimensional code words, a serial-to-parallel converter for converting a serial stream of blocks of eight binary bits into sequences of eight parallel bits, five of said eight parallel bits being used to address any one of said thirty-two code words in said read only memory after passing through a means for converting binary 1's to −1's and binary 0's to 1's, the remaining three bits of said eight parallel bits being the input to a convolutional encoder having three bits of memory, said convolutional encoder being used to expand said three bits of input to four bits of output, means for converting said four bits of output from said convolutional encoder from binary 1's to −1's and from binary 0's to 1's, and means for multiplying each component said four numbers from said read only memory by said four output bits from said convolutional encoder to derive any one of said five hundred and twelve four dimensional code words.

*21. A method for coding information comprising the steps of*

*separating said information into first and second groups of signals,*

*encoding the signals in said second group to provide an expanded group of signals,*

*addressing any one of a plurality of multidimensional code words by said first group of signals, and*

*determining the sign of each component of said multidimensional code words by said expanded group of signals.*

*22. A method for coding information to generate an output code word, said method comprising the steps of*

*separating said information into first and second groups of signals,*

*encoding the signals in said second group to provide an expanded group of signals,*

*identifying one of a plurality of multi-dimensional code words in response to said first group of signals, and*

*generating said output code word by changing the sign of at least one of the components of said identified code word as a function of said expanded group of signals.*

*23. A method for generating output code words in response to successive blocks of input signals, each of said blocks comprising first and second groups of said input signals, said method comprising the steps of*

*identifying for each one of said blocks, and in response to said first group of signals of that block, one of a predetermined plurality of multidimensional code words*

*generating an individual one of said output code words by changing the sign of at least a selected one of the components of said one of said code words in response to a plurality of trellis coded signals, said trellis coded signals being a function of (a) the signals of the second group of signals of said one of said blocks and (b) at least one bit of the second group of signals of a previous one of said blocks.*

*24. A method for generating a sequence of output signals in response to a sequence of multidigit input words, each of said output signals representing a respective signal point ($x_1$, $x_2$, $x_3$, $x_4$) of a predetermined alphabet of four-dimensional signal points, said method comprising the steps of*

*identifying, in response to the values of a selected number of digits of each input word in said input word sequence and the value of at least one digit of a previous input word in said input word sequence, one of a plurality of sets of said signal points, the number of said sets being greater than 2 raised to said selected number, and, in each said set, $x_1$, $x_2$, $x_3$ and $x_4$ being, for all the points in that set, congruent, modulo a predetermined number, to $w_1$, $w_2$, $w_3$ and $w_4$, respectively, $w_1$, $w_2$, $w_3$ and $w_4$ being predetermined integers each having a value associated with said each set,*

*identifying, in response at least to the digits of said each input word other than said selected number of digits, a particular one of the signal points of said one set, and*

*generating as an individual one of said sequence of output signals a signal representing the identified signal point.*

*25. The invention of claim 24 wherein $w_1$, $w_2$, $w_3$ and $w_4$ can each take on one of the two values $+1$ and $-1$, wherein $x_1$, $x_2$, $x_3$ and $x_4$ are all odd integers and wherein said predetermined number is 4.*

*26. A method for generating a sequence of output signals in response to a sequence of binary input words, each of said output signals representing a respective signal point of a predetermined alphabet of multi-dimensional signal points, said signal points being at least of dimension four, said method comprising the steps of*

*identifying, in response to the values of a selected number of bits of each input word in said input word sequence and the value of at least one bit of a previous input word in said input word sequence, one of a plurality of sets of said signal points, the number of said sets being greater than 2 raised to said selected number, said plurality of sets comprising a first set of said signal points and a plurality of further sets of said signal points, each of the points in each said further set being given by a predetermined pattern of sign changes associated with said further set applied to the coordinates of the signal points of said first set,*

*identifying, in response at least to the bits of said each input word other than said selected number of bits, a particular one of the signal points of said one set, and*

*generating as an individual one of said sequence of output signals a signal representing the identified signal point.*

*27. Apparatus for generating output code words in response to successive blocks of input bits, each of said blocks comprising first and second groups of said input bits, said apparatus comprising*

*means for identifying for each one of said blocks and in response to said first group of bits of that block, one of a predetermined plurality of multidimensional code words,*

*means for generating an individual one of said output code words by changing the respective signs of selected ones of the components of said one of said code words in response to a plurality of trellis coded bits, said trellis coded bits being a function of (a) the bits of the second group of bits of said one of said blocks and (b) at least one bit of the second group of bits of a previous one of said blocks.*

*28. A data transmitter adapted to generate a sequence of output signals in response to a sequence of binary input words, each of said output signals representing a respective signal point ($x_1$, $x_2$, $x_3$, $x_4$) of a predetermined alphabet of four-dimensional signal points, said transmitter comprising*

*means responsive to the values of a selected number of bits of each input word in said input word sequence and the value of at least one bit of a previous input word in said input word sequence for identifying one of a plurality of sets of said signal points, the number of said sets being greater than 2 raised to said selected number, and, in each said set, $x_1$, $x_2$, $x_3$ and $x_4$ being, for all the points in that set, congruent, modulo a predetermined number, to $w_1$, $w_2$, $w_3$ and $w_4$, respectively, $w_1$, $w_2$, $w_3$ and $w_4$ being predetermined integers each having a value associated with said each set,*

*means responsive at least to the bits of said each input word other than said selected number of bits for identifying a particular one of said signal points of said one set, and*

*means for generating as an individual one of said sequence of output signals a signal representing the identified signal point.*

*29. The invention of claim 28 wherein $w_1$, $w_2$, $w_3$ and $w_4$ can each take on one of the two values $+1$ and $-1$, wherein $x_1$, $x_2$, $x_3$ and $x_4$ are all odd integers and wherein said predetermined number is 4.*

*30. A data transmitter adapted to generate a sequence of output signals in response to a sequence of multidigit input words, each of said output signals representing a respective signal point of a predetermined alphabet of multi-dimensional signal points, said signal points being at least of dimension four, said transmitter comprising*

*means responsive to the values of a selected number of digits of each input word in said input word sequence and the value of at least one digit of a previous input word in said input word sequence for identifying one of a plurality of sets of said signal points, the number of said sets being greater than 2 raised to said selected number, said plurality of sets comprising a first set of said signal points and a plurality of further sets of said signal points, each of the points in each said further set being given by a predetermined pattern of sign changes associated with said further set applied to the coordinates of the signal points of said first set,*

*means responsive at least to the digits of said each input word other than said selected number of digits for identifying a particular one of the signal points of said one set, and*

*means for generating as an individual one of said sequence of output signals a signal representing the identified signal point.*

* * * * *

UNITED STATES PATENT AND TRADEMARK OFFICE

CERTIFICATE OF CORRECTION

PATENT NO. : Re. 33,041

DATED : August 29, 1989

INVENTOR(S) : Arthur R. Calderbank and Neil J. A. Sloane

It is certified that error appears in the above-identified patent and that said Letters Patent is hereby corrected as shown below:

In the Detailed Description, Column 4, line 13, "$x^j,\ldots,x^{(j+1-L)}$" should read --$\hat{x}^j,\ldots,\hat{x}^{(j+1-L)}$--; line 18, "$x^1 - x^1$" should read --$\hat{x}^1 - x^1$--; line 53, "codded" should read --coded--. Column 5, line 13, "$v_1{}^i = a_1{}^i$" should read --$\bar{v}_1{}^i = \bar{a}_1{}^i$--; line 15, "$v_2{}^i = a_1{}^i$" should read --$\bar{v}_2{}^i = \bar{a}_2{}^i$--; line 17, "$v_3 = a_1{}^i$" should read --$\bar{v}_3 = \bar{a}_1{}^i$--; line 19, "$v_4 = a_1{}^i$" should read --$\bar{v}_4 = \bar{a}_1{}^i$--; line 60, "uncoated" should read --uncoded--. Column 6, line 66, insert --1-- under heading "$a_4$". Column 8, line 6, "$v^i - v^1$" should read --$v^i - \hat{v}^i$--; line 13, "$(S(v)\cdot S(v))$" should read --$(S(v^i)\cdot S(\hat{v}^i))$--; line 39, "uncoated" should read --uncoded--.

Signed and Sealed this

Sixteenth Day of April, 1991

*Attest:*

*Attesting Officer*

HARRY F. MANBECK, JR.

*Commissioner of Patents and Trademarks*